United States Patent [19]
Kimberly

[11] 3,757,243
[45] Sept. 4, 1973

[54] AMPLIFIER AND PROTECTION CIRCUITRY THEREFOR

[75] Inventor: William E. Kimberly, Euclid, Ohio

[73] Assignee: Keithley Instruments, Inc., Solon, Ohio

[22] Filed: Jan. 14, 1972

[21] Appl. No.: 217,810

[52] U.S. Cl. .............. 330/207 P, 200/181, 317/144, 328/8
[51] Int. Cl. .............. H03g 11/00
[58] Field of Search .............. 330/207 P, 51; 328/8, 10; 200/181; 317/144, 33; 331/62

[56] References Cited

UNITED STATES PATENTS

| | | | |
|---|---|---|---|
| 1,930,758 | 10/1933 | Laurent | 317/144 |
| 3,051,788 | 8/1962 | Seeley | 330/207 P |
| 3,277,386 | 10/1966 | Miyazawa | 330/207 P |
| 3,292,111 | 12/1966 | Cotton | 200/181 |
| 3,526,810 | 9/1970 | Williams et al. | 330/207 P |
| 3,555,358 | 1/1971 | Gibbs | 330/11 |
| 3,564,338 | 2/1971 | Teshirogi | 330/207 P |
| 3,646,397 | 4/1970 | Spells, Jr. | 330/207 P |

FOREIGN PATENTS OR APPLICATIONS

| | | | |
|---|---|---|---|
| 45/21521 | 2/1967 | Japan | 330/207 P |

*Primary Examiner*—John Kominski
*Attorney*—J. Herman Yount, Jr. and Robert B. Sundheim et al.

[57] ABSTRACT

Amplifier having an input circuit protected by contacts which are actuated between open and closed conditions in response to the output of the amplifier to protect the circuit against high input signals. A piezoelectric crystal is stressed by the output of the amplifier to open contacts in series with the input or to close contacts to make a shunt circuit across the input.

7 Claims, 4 Drawing Figures

AMPLIFIER AND PROTECTION CIRCUITRY THEREFOR

The present invention relates to amplifying circuits, and, more particularly, to amplifying circuits which are to be protected against high input signals.

An object of the present invention is to provide a new and improved amplifying circuit in which the amplifier is protected against high transient input signals by circuit means which operate in response to the output of the amplifier to open an input circuit or to close an open circuit to shunt the input to the amplifier.

A still further object of the present invention is to provide a new and improved amplifier in which a piezoelectric crystal is stressed by the output of the amplifier to open the input circuit or to close a normally open shunt circuit for protecting the input of the amplifier against high transient input signals.

Further objects and advantages of the present invention will be apparent from the following detailed description of the preferred embodiments thereof, made with reference to the accompanying drawings in which.

Figure 1:
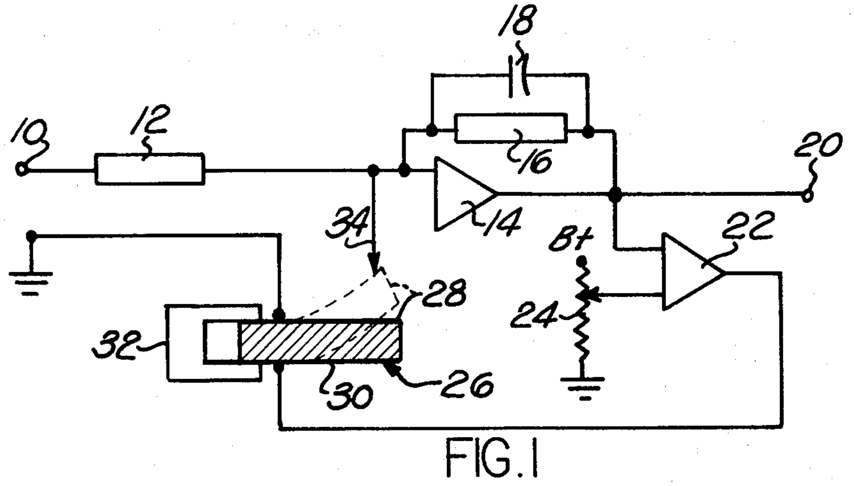
FIG. 1 is a schematic illustration of an operational amplifier having its input circuit protected in accordance with the present invention.

Referring now to the drawings wherein the showings are for purposes of illustrating preferred embodiments of the invention only and not for purposes of limiting same, FIG. 1 illustrates an amplifier circuit having an input terminal 10 connected through an impedance 12, such as a resistor, to one input of a conventional operational amplifier 14, having a feedback impedance 16 connected between the input and output circuits thereof. A time delay capacitor 18 is connected in parallel with impedance 16. The output of the amplifier circuit is taken between ground and output terminal 20 and is applied to one input of a bipolar comparator 22. Comparator 22 has a second input connected to a wiper arm of a potentiometer 24 having its resistive portion connected between ground and a B+ voltage supply source. Comparator 22 serves to provide a positive output signal when the magnitude of the output potential, regardless of polarity, at terminal 20 is greater than that of the reference signal taken from the wiper arm of potentiometer 24. The output signal taken from comparator 22 is applied to a piezoelectric crystal 26. Crystal 26 is a conventional piezoelectric crystal provided with conductive electrodes 28 and 30 on its oppositely facing major surfaces, and is clamped at one end by an insulated clamp 32 to the chassis of the instrument so that it will bend about the one end when stressed electrically.

When the output voltage of the amplifier circuit exceeds the reference level set by the wiper arm of potentiometer 20, this is indicative that the input signal applied to input terminal 10 is too high and against which the amplifier circuit is to be protected. Consequently, comparator 22 applies a positive signal to the crystal 28. This stresses the crystal so that it bends toward and electrically engages stationary contact 34, as shown in FIG. 1 by the dotted lines. This causes the input signal applied to input terminal 10 to be shorted to ground through the conductive surface 28 on crystal 26. The rise of the signal applied to the operational amplifier 14 is delayed by capacitor 18 so as to compensate for the characteristic signal response time, in milliseconds, of the piezoelectric crystal 26.

Figure 2:
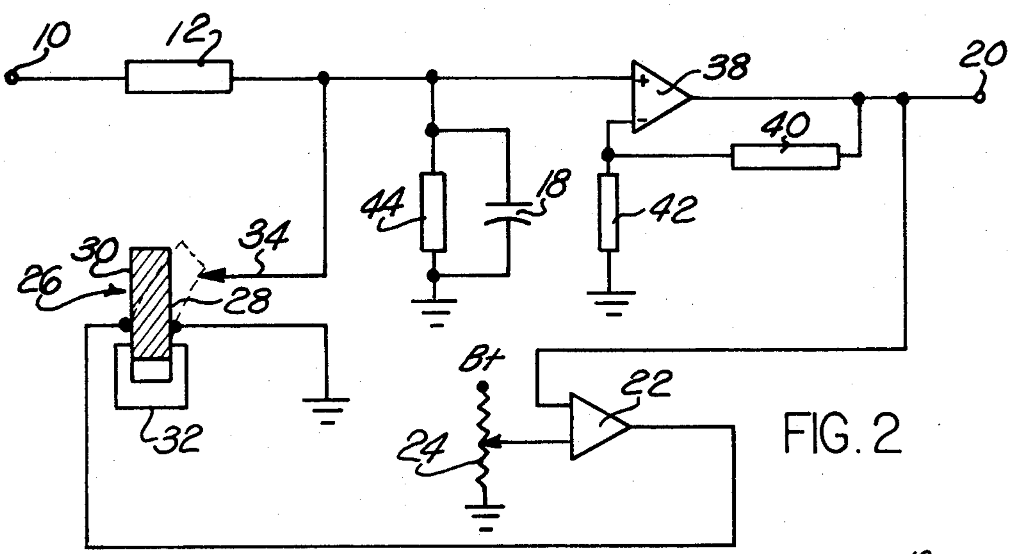
FIG. 2 is a schematic illustration illustrating a second embodiment of the present invention.

The embodiment shown in FIG. 2 is quite similar to that described above with reference to FIG. 1 and, consequently, to simplify the description of the invention like components in both figures are identified with like character references. The amplifier circuit differs from that in FIG. 1 by inclusion of an impedance 40 connected from the output circuit of a conventional operational amplifier 38 to the inverting input of the amplifier, and an impedance 42 connected between the inverting input and ground. The time delay capacitor 18 is connected across an impedance 44, which is connected between the noninverting input of amplifier 38 and ground. The operation of this embodiment of the invention is essentially the same as that described previously with reference to FIG. 1.

Figure 3:
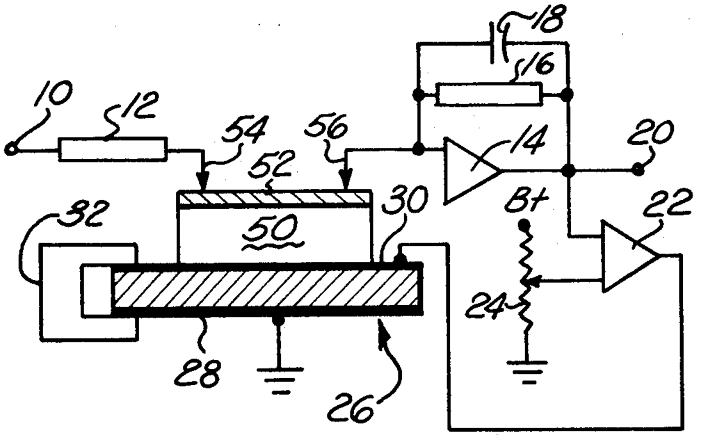
FIG. 3 is a schematic illustration of a third embodiment of the invention.

Reference is now made to the embodiment of the invention shown in FIG. 3 which is quite similar to that described hereinbefore with reference to FIG. 1 and, consequently, like components are identified with like character references in both Figures for purposes of simplifying the description of the invention. This embodiment is particularly useful for circuits wherein it is desirable to completely open the input circuit when the amplifier circuit is to be protected against a high input signal. This is particularly true when the circuit is being employed to measure voltages. Thus, in the modification as shown in FIG. 3, piezoelectric crystal 26 has its conductive surface 30 connected to the output of bipolar comparator 22 and conductive surface 28 is connected to ground. In addition, an insulator block 50 is suitably mounted to conductive surface 30 and carries an electrical contact 52. Contact 52 normally engages a pair of stationary contacts 54 and 56. Stationary contact 54 is connected through impedance 12 to the input terminal 10 of the amplifier circuit, whereas stationary contact 56 is connected to the input of the operational amplifier 14. When the signal applied to input terminal 10 is sufficiently high that a positive output voltage is obtained from comparator 22, crystal 26 is stressed so that it bends away from contacts 54 and 56, thereby providing an open circuit in the input circuit of the amplifier circuit.

Figure 4:
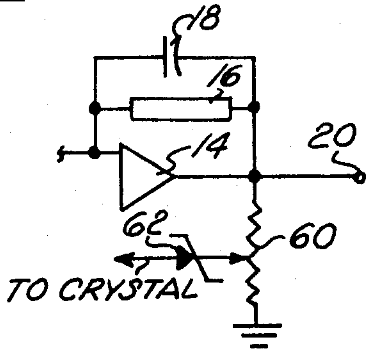
FIG. 4 is a partial schematic illustration of a still further embodiment of the present invention.

The bipolar comparator 22, described hereinbefore with reference to the embodiment shown in FIGS. 1, 2 and 3, may be replaced with a less sophisticated threshold detector circuit in the form of a Zener diode for amplifier output signals of positive polarity. An alternative construction of this nature is shown in the partial schematic diagram of FIG. 4, wherein the output of operational amplifier 14 is applied across the resistive portion of a potentiometer 60 having its wiper arm connected to the crystal through a Zener diode 62, poled as shown. In this embodiment the crystal will not be stressed until the output voltage of the amplifier circuit is sufficiently great to cause the Zener diode 62 to break down.

Whereas the crystals employed in the embodiments shown in FIGS. 1 through 4 will return to their normal state when the amplifiers lose their output signals in response to the opening or shunting of the input circuits a normal transient will have passed by the time the contacts are again opened, as in the embodiment of FIGS.

1 and 2, or are again closed, as in the embodiment of FIG. 3. A constant overload may cause the circuit to oscillate; however, the input will be protected and the circuit will recover as soon as the overload is removed.

The invention has been described with reference to preferred embodiments; however, it is to be appreciated that the invention is not limited to same as various modifications may be made without departing from the spirit and scope of the invention as defined in the appended claims.

Having thus described my invention, I claim:

1. In an electrical system including an amplifier having an input circuit for receiving an input signal and an output circuit for carrying an output signal, protective circuit means connected to said input circuit comprising at least one stationary contact electrically connected to said input circuit and a movable electric contact comprising an electric field actuatable element having a layer of electrically conductive material thereon, said movable contact having a normal first position for permitting application of a said input signal to said amplifier and a second position for preventing application of a said input signal to said amplifier when said element is actuated by application of an electric field thereto, said movable contact being positioned relative to said stationary contact so that when it is in a selected one of said positions an electric circuit is completed between said stationary contact and said electrically conductive material defining a path for current flow for said input signal, and means responsive to a said output signal of at least a predetermined magnitude for applying a said electric field to said element to actuate said movable contact to move from its said normal first position to said second position.

2. An electrical system as set forth in claim 1, including circuit means for connecting said conductive material to a reference potential so that when said movable contact is in the selected one of said positions the input circuit of said amplifier is shunted to said reference potential to thereby protect the amplifier against high input signals.

3. An electrical system as set forth in claim 1, wherein said means responsive to said output signal includes comparison means having one input for receiving a said output signal and a second input for receiving a threshold signal and an output circuit for carrying a control signal when said output signal exceeds said threshold signal, said comparison means output circuit being connected to said element for applying an electric potential thereto of a polarity to cause said movable contact to be displaced from its normal first position to its second position so that said conductive material makes electrical contact with said stationary contact and thereby provide a shunt circuit across the input of said amplifier.

4. An electrical system as set forth in claim 3, wherein said element is a piezoelectric crystal.

5. An electrical system as set forth in claim 1, wherein said normal position of said movable contact is such that said electrically conductive material makes electrical engagement with said stationary contact, electrical circuit means connected to said electrically conductive material for receiving a said input signal so that when said movable contact is displaced from its normal position to its second position an open circuit is presented on the input side of said amplifier to prevent application of said input signal to said amplifier.

6. An electrical system as set forth in claim 5, wherein said means responsive to said output signal includes comparison means having one input for receiving a said output signal and a second input for receiving a threshold signal and an output circuit for carrying a control signal when said output signal exceeds said threshold signal, said comparison means output circuit being connected to said element for applying an electric potential thereto of a polarity to cause said movable contact to be displaced from its normal first position to its second position so that said conductive material makes electrical contact with said stationary contact and thereby present a said open circuit on the input side of said amplifier.

7. An electrical system as set forth in claim 6, wherein said element is a piezoelectric crystal.

* * * * *